United States Patent
Park et al.

(10) Patent No.: US 10,122,567 B2
(45) Date of Patent: Nov. 6, 2018

(54) SIGNAL MULTIPLEXING DEVICE AND SIGNAL MULTIPLEXING METHOD USING LAYERED DIVISION MULTIPLEXING

(71) Applicant: ELECTRONICS AND TELECOMMUNICATIONS RESEARCH INSTITUTE, Daejeon (KR)

(72) Inventors: Sung-Ik Park, Daejeon (KR); Jae-Young Lee, Daejeon (KR); Sun-Hyoung Kwon, Daejeon (KR); Heung-Mook Kim, Daejeon (KR); Nam-Ho Hur, Sejong (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/121,010

(22) PCT Filed: Feb. 25, 2015

(86) PCT No.: PCT/KR2015/001817
§ 371 (c)(1),
(2) Date: Aug. 23, 2016

(87) PCT Pub. No.: WO2015/130077
PCT Pub. Date: Sep. 3, 2015

(65) Prior Publication Data
US 2017/0012811 A1    Jan. 12, 2017

(30) Foreign Application Priority Data

Feb. 25, 2014 (KR) .................. 10-2014-0021978
Feb. 24, 2015 (KR) .................. 10-2015-0026040

(51) Int. Cl.
*H04L 27/26* (2006.01)
*H03M 13/27* (2006.01)
(Continued)

(52) U.S. Cl.
CPC ........ *H04L 27/2697* (2013.01); *H03M 13/27* (2013.01); *H04L 1/00* (2013.01);
(Continued)

(58) Field of Classification Search
CPC .................................................. H04L 27/2697
See application file for complete search history.

(56) References Cited

U.S. PATENT DOCUMENTS

| | | | | |
|---|---|---|---|---|
| 6,798,838 | B1* | 9/2004 | Ngo ................ | H04L 1/0003 |
| | | | | 348/E5.003 |
| 2004/0014482 | A1* | 1/2004 | Kwak ............... | H04W 56/00 |
| | | | | 455/522 |

(Continued)

FOREIGN PATENT DOCUMENTS

WO    WO 2010/019018 A2    2/2010

OTHER PUBLICATIONS

International Search Report for International Patent Application No. PCT/KR2015/001817 filed Feb. 25, 2015.

(Continued)

*Primary Examiner* — John Blanton

(57) ABSTRACT

An apparatus and method for multiplexing signals using layered division multiplexing are disclosed. A signal multiplexing apparatus according to an embodiment of the present invention includes a combiner configured to combine a core layer signal and an enhanced layer signal at different power levels, and a time interleaver configured to perform interleaving applied to both the core layer signal and the enhanced layer signal.

3 Claims, 12 Drawing Sheets

(51) Int. Cl.
*H04L 1/00* (2006.01)
*H04L 5/00* (2006.01)

(52) U.S. Cl.
CPC .......... *H04L 1/0041* (2013.01); *H04L 1/0048* (2013.01); *H04L 1/0061* (2013.01); *H04L 1/0071* (2013.01); *H04L 5/0007* (2013.01); *H04L 27/2601* (2013.01); *H04L 2001/0098* (2013.01)

(56) References Cited

U.S. PATENT DOCUMENTS

| | | | |
|---|---|---|---|
| 2009/0042511 A1* | 2/2009 | Malladi | H04L 5/023 455/62 |
| 2010/0046675 A1 | 2/2010 | Collins et al. | |
| 2010/0260268 A1 | 10/2010 | Cowan et al. | |
| 2011/0039595 A1* | 2/2011 | Luo | H04W 52/243 455/522 |
| 2012/0092452 A1 | 4/2012 | Tourapis et al. | |
| 2012/0106482 A1 | 5/2012 | Pajukoski et al. | |
| 2012/0144433 A1* | 6/2012 | Won | H04N 21/23432 725/62 |
| 2014/0010154 A1 | 1/2014 | Hong et al. | |
| 2017/0155535 A1* | 6/2017 | Hong | H04L 27/2649 |

OTHER PUBLICATIONS

Jing Lei et al., "A Backward-Compatible Solution for Next Generation DVB-C System", IEEE International Conference on Communications, 2008: ICC '08; May 19-23, 2008, pp. 1962-1966, IEEE, Piscataway, New Jersey USA.

Francisco J. Vazquez-Araujo, "Approaching the MIMO capacity with Superposition Coded Modulation", 2010 $6^{th}$ International Symposium on Turbo Codes and Iterative Information Processing (ISTC), Sep. 6, 2010, pp. 299-303, IEEE, Piscataway, New Jersey USA.

Marc Adrat et al., "On considering hierarchical modulation in the porting process of legacy waveforms to software defined radio" Analog Integrated Circuits and Signal Processing, Aug. 29, 2013, pp. 729-739, vol. 78, No. 3, Springer.

* cited by examiner

SIGNAL MULTIPLEXING DEVICE AND SIGNAL MULTIPLEXING METHOD USING LAYERED DIVISION MULTIPLEXING

The present application is a National Stage of International Patent Application No. PCT/KR2015/001817, filed on Feb. 25, 2015, which claims the benefit of Korean Patent Application Nos. 10-2014-0021978 filed on Feb. 25, 2014 and 10-2015-0026040 filed on Feb. 24, 2015, with the Korean Intellectual Property Office, the disclosures of which are incorporated herein by reference in their entirety.

TECHNICAL FIELD

The present invention relates to broadcast signal transmission/reception technology adapted for use in a broadcasting system and, more particularly, to a broadcast signal transmission/reception system that multiplexes/demultiplexes and then transmits/receives two or more signals.

BACKGROUND ART

Bit-Interleaved Coded Modulation (BICM) is bandwidth-efficient transmission technology, and is implemented in such a manner that an error-correction coder, a bit-by-bit interleaver and a high-order modulator are combined with one another.

BICM can provide excellent performance using a simple structure because it uses a low-density parity check (LDPC) coder or a Turbo coder as the error-correction coder. Furthermore, BICM can provide high-level flexibility because it can select modulation order and the length and code rate of an error correction code in various forms. Due to these advantages, BICM has been used in broadcasting standards, such as DVB-T2 and DVB-NGH, and has a strong possibility of being used in other next-generation broadcasting systems.

In general, in order to multiplex signals, Time Division Multiplexing (TDM) or Frequency Division Multiplexing (FDM) is widely used. Recently, there is an urgent need for new multiplexing technology that is applicable to a next generation broadcasting system and provides greater flexibility and performance than TDM and FDM.

DISCLOSURE

Technical Problem

An object of the present invention is to provide a new signal multiplexing technology that is capable of providing greater flexibility and performance than TDM and FDM.

Another object of the present invention is to efficiently multiplex/demultiplex signals corresponding to two or more layers by combining the signals at different respective power levels.

Technical Solution

In order to accomplish the above objects, the present invention provides a signal multiplexing apparatus, including: a combiner configured to combine a core layer signal and an enhanced layer signal at different power levels; and a time interleaver configured to perform interleaving applied to both the core layer signal and the enhanced layer signal.

In this case, the signal multiplexing apparatus may further include an injection level controller configured to generate a power-reduced enhanced layer signal by reducing the power of the enhanced layer signal; and the combiner may generate a multiplexed signal by combining the core layer signal and the power-reduced enhanced layer signal.

In this case, the signal multiplexing apparatus may further include: a core layer Bit-Interleaved Coded Modulation (BICM) unit configured to correspond to the core layer signal; and an enhanced layer BICM unit configured to perform Bit-Interleaved Coded Modulation (BICM) encoding different from that of the core layer BICM unit.

In this case, the core layer BICM unit may have a lower bit rate than the enhanced layer BICM unit, and may be more robust than the enhanced layer BICM unit.

In this case, the signal multiplexing apparatus may further include a power normalizer configured to reduce the power of the multiplexed signal to power corresponding to the core layer signal.

In this case, the power normalizer may correspond to a normalizing factor, and may reduce the power of the multiplexed signal by an amount by which the power has been increased by the combiner.

In this case, the injection level controller may correspond to a scaling factor; each of the normalizing factor and the scaling factor may be a value that is larger than 0 and smaller than 1; the scaling factor may decrease as a reduction in power corresponding to the injection level controller becomes larger; and the normalizing factor may increase as a reduction in power corresponding to the injection level controller becomes larger.

In this case, the injection level controller may change an injection level between 3.0 dB and 10.0 dB in steps of 0.5 dB.

In this case, the enhanced layer signal may correspond to enhanced layer data that is restored based on cancellation corresponding to the restoration of core layer data corresponding to the core layer signal.

In this case, the core layer BICM unit may include: a core layer error correction encoder configured to perform error correction encoding on the core layer data; a core layer bit interleaver configured to perform bit interleaving corresponding to the core layer data; and a core layer symbol mapper configured to perform modulation corresponding to the core layer data.

In this case, the enhanced layer BICM unit may include: an enhanced layer error correction encoder configured to perform error correction encoding on the enhanced layer data; an enhanced layer bit interleaver configured to perform bit interleaving corresponding to the enhanced layer data; and an enhanced layer symbol mapper configured to perform modulation corresponding to the enhanced layer data.

In this case, the enhanced layer error correction encoder may have a higher bit rate than the core layer error correction encoder; and the enhanced layer symbol mapper may be less robust than the core layer symbol mapper.

In this case, the combiner may combine one or more extension layer signals, having lower power levels than the core layer signal and the enhanced layer signal, with the core layer signal and the enhanced layer signal.

An embodiment of the present invention provides a signal multiplexing method, including: combining a core layer signal and an enhanced layer signal at different power levels; and performing interleaving applied to both the core layer signal and the enhanced layer signal.

In this case, the signal multiplexing method may further include generating a power-reduced enhanced layer signal by reducing the power of the enhanced layer signal; and the combining may include generating a multiplexed signal by combining the core layer signal and the power-reduced enhanced layer signal.

In this case, the signal multiplexing method may further include reducing power of the multiplexed signal to power corresponding to the core layer signal.

In this case, the reducing power of the multiplexed signal may include reducing the power of the multiplexed signal by an amount by which the power has been increased by the combining.

In this case, the generating a power-reduced enhanced layer signal may include changing an injection level between 3.0 dB and 10.0 dB in steps of 0.5 dB.

In this case, the combining may include combining one or more extension layer signals, having lower power levels than the core layer signal and the enhanced layer signal, with the core layer signal and the enhanced layer signal.

Advantageous Effects

According to the present invention, a new signal multiplexing technology that is capable of providing greater flexibility and performance than TDM and FDM is provided.

Furthermore, according to the present invention, signals corresponding to two or more layers can be efficiently multiplexed/demultiplexed by combining the signals at different respective power levels.

MODE FOR INVENTION

Figure 1:
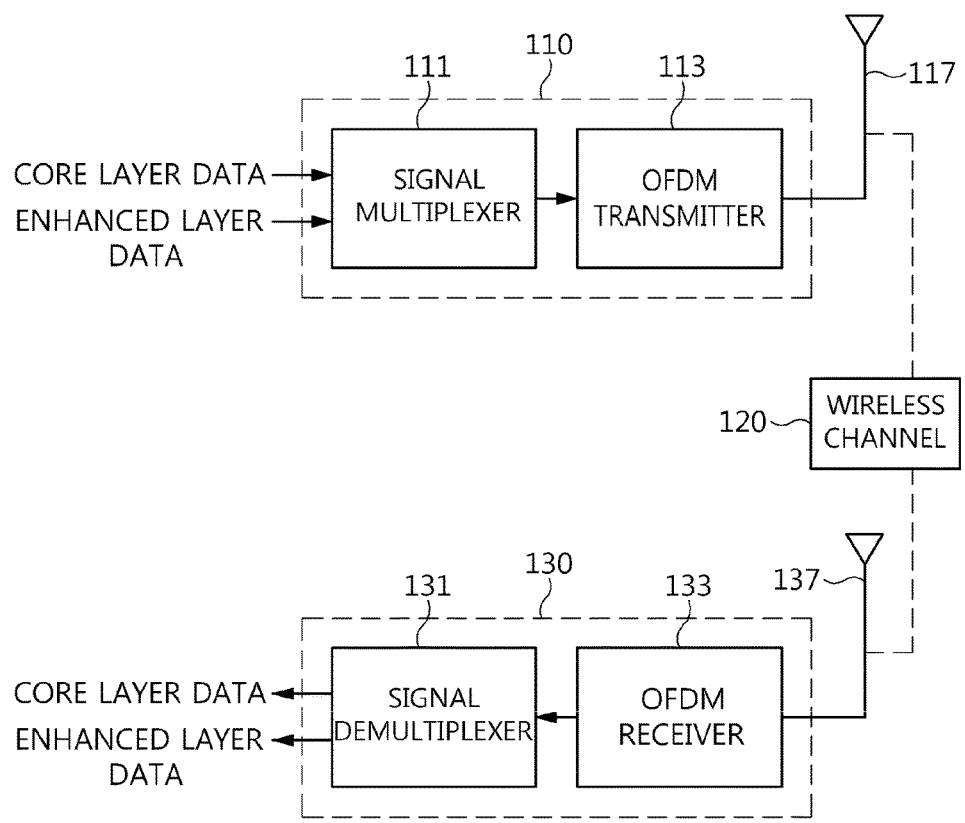
FIG. 1 is a block diagram illustrating a broadcast signal transmission/reception system according to an embodiment of the present invention.

Embodiments of the present invention will be described in detail below with reference to the accompanying drawings. Redundant descriptions and descriptions of well-known functions and configurations that have been deemed to make the gist of the present invention unnecessarily obscure will be omitted below. The embodiments of the present invention are intended to fully describe the present invention to persons having ordinary knowledge in the art to which the present invention pertains. Accordingly, the shapes, sizes, etc. of components in the drawings may be exaggerated to make the description obvious.

Preferred embodiments according to the present invention are described in detail with reference to the accompanying drawings.

FIG. 1 is a block diagram illustrating a broadcast signal transmission/reception system according to an embodiment of the present invention.

Referring to FIG. 1, a broadcast signal transmission/reception system according to an embodiment of the present invention includes a broadcast signal transmission apparatus 110, a wireless channel 120, and a broadcast signal reception apparatus 130.

The broadcast signal transmission apparatus 110 includes a signal multiplexer 111 for multiplexing core layer data and enhanced layer data, and an OFDM transmitter 113.

The signal multiplexer 111 combines a core layer signal corresponding to core layer data and an enhanced layer signal corresponding to enhanced layer data at different power levels, and generates a multiplexed signal by performing interleaving applied to both the core layer signal and the enhanced layer signal.

The OFDM transmitter 113 transmits the multiplexed signal using an OFDM communication method via an antenna 117, thereby allowing the transmitted OFDM signal to be received via the antenna 137 of the broadcast signal reception apparatus 130 over the wireless channel 120.

The broadcast signal reception apparatus 130 includes an OFDM receiver 133 and a signal demultiplexer 131. When the signal transmitted over the wireless channel 120 is received via the antenna 137, the OFDM receiver 133 receives an OFDM signal through synchronization, channel estimation, and equalization.

The signal demultiplexer 131 restores the core layer data from the signal received via the OFDM receiver 133 first, and then restores the enhanced layer data via cancellation corresponding to the restored core layer data.

Although not explicitly illustrated in FIG. 1, broadcast signal transmission/reception system according to an embodiment of the present invention may multiplex/demultiplex one or more pieces of extension layer data in addition to the core layer data and the enhanced layer data. In this case, the extension layer data may be multiplexed at a power level lower than that of the core layer data and the enhanced layer data. Furthermore, when two or more extension layers are included, the injection power level of a second extension layer may be lower than the injection power level of a first extension layer, and the injection power level of a third extension layer may be lower than the injection power level of the second extension layer.

Figure 2:
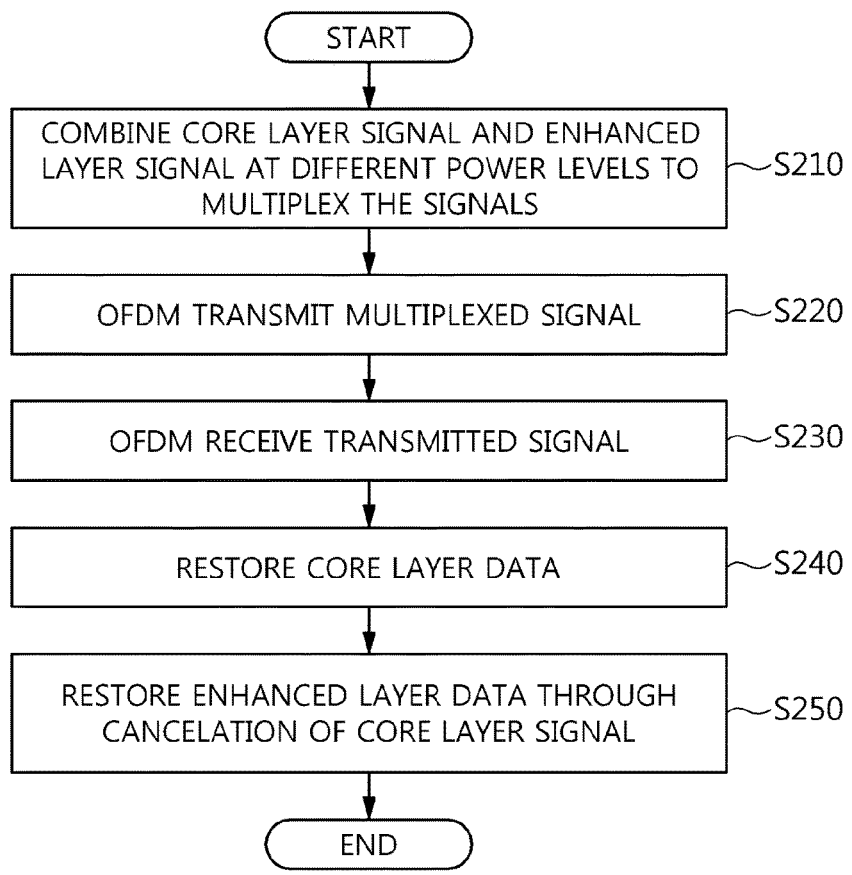
FIG. 2 is an operation flowchart illustrating a broadcast signal transmission/reception method according to an embodiment of the present invention.

FIG. 2 is an operation flowchart illustrating a broadcast signal transmission/reception method according to an embodiment of the present invention.

Referring to FIG. 2, in the broadcast signal transmission/reception method according to the present embodiment, a core layer signal and an enhanced layer signal are combined at different power levels to multiplex the signals at step S210.

Furthermore, in the broadcast signal transmission/reception method according to the present embodiment, the multiplexed signal is OFDM transmitted at step S220.

Furthermore, in the broadcast signal transmission/reception method according to the present embodiment, the transmitted signal is OFDM received at step S230.

In this case, at step S230, synchronization, channel estimation and equalization may be performed.

Furthermore, in the broadcast signal transmission/reception method according to the present embodiment, core layer data is restored from the received signal at step S240.

Furthermore, in the broadcast signal transmission/reception method according to the present embodiment, enhanced layer data is restored through the cancellation of the core layer signal at step S250.

In particular, steps S240 and S250 illustrated in FIG. 2 may correspond to demultiplexing operations corresponding to step S210.

Figure 3:
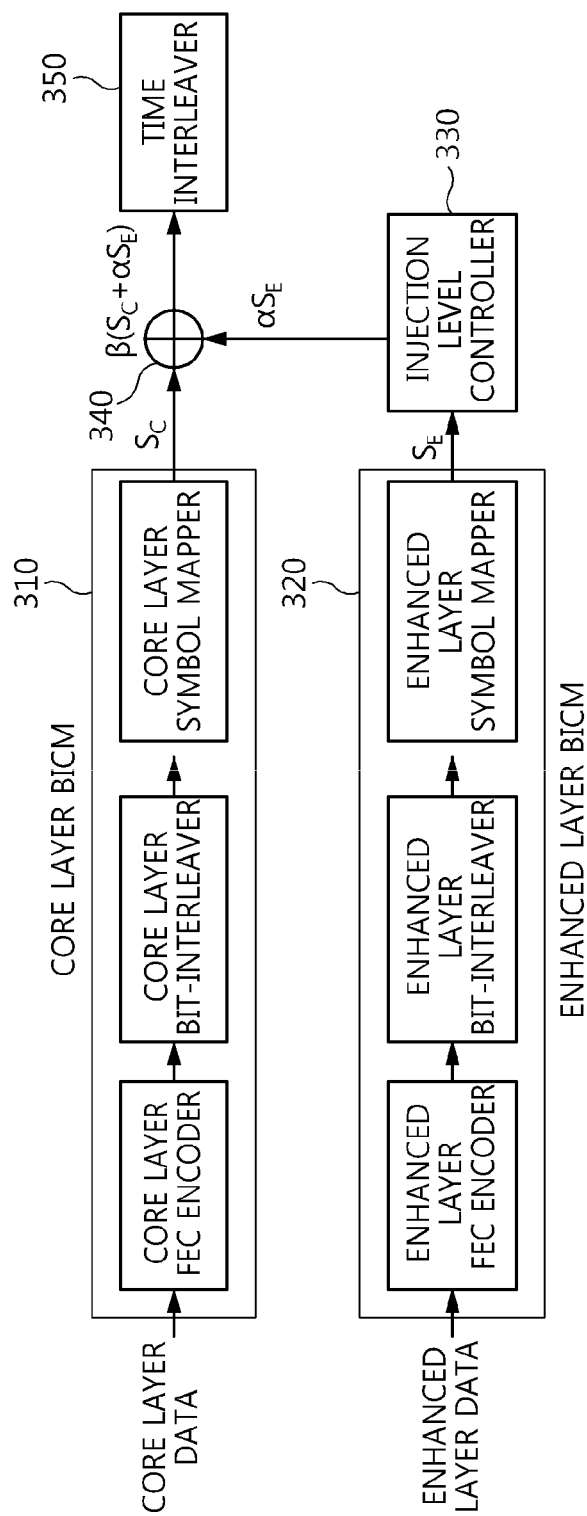
FIG. 3 is a block diagram illustrating an example of the signal multiplexer illustrated in FIG. 1.

FIG. 3 is a block diagram illustrating an example of the signal multiplexer illustrated in FIG. 1.

Referring to FIG. 3, a signal multiplexer according to an embodiment of the present invention may include a core layer Bit-Interleaved Coded Modulation (BICM) unit 310, an enhanced layer BICM unit 320, an injection level controller 330, a combiner 340, and a time interleaver 350.

Generally, a Bit-Interleaved Coded Modulation (BICM) device includes an error correction encoder, a bit interleaver, and a symbol mapper. Each of the core layer BICM unit 310 and the enhanced layer BICM unit 320 illustrated in FIG. 3 may include an error correction encoder, a bit interleaver, and a symbol mapper.

As illustrated in FIG. 3, core layer data and enhanced layer data passes through different respective BICM units, and are then combined by the combiner 340.

That is, the core layer data passes through the core layer BICM unit 310, the enhanced layer data passes through the enhanced layer BICM unit 320 and then the injection level controller 330, and the core layer data and the enhanced layer data are combined by the combiner 340. In this case, the enhanced layer BICM unit 320 may perform BICM encoding different from that of the core layer BICM unit 310. That is, the enhanced layer BICM unit 320 may perform higher bit rate error correction encoding or symbol mapping than the core layer BICM unit 310. Furthermore, the enhanced layer BICM unit 320 may perform less robust error correction encoding or symbol mapping than the core layer BICM unit 310.

For example, the core layer error correction encoder may exhibit a lower bit rate than the enhanced layer error correction encoder. In this case, the enhanced layer symbol mapper may be less robust than the core layer symbol mapper.

The combiner 340 may be viewed as functioning to combine the core layer signal and the enhanced layer signal at different power levels.

The core layer data uses forward error correction (FEC) code having a low code rate in order to perform robust reception, while the enhanced layer data uses FEC code having a high code rate in order to achieve a high data transmission rate.

That is, the core layer data may have a broader coverage than the enhanced layer data in the same reception environment.

The enhanced layer data having passed through the enhanced layer BICM unit 320 is adjusted in gain (or power) by the injection level controller 330, and is combined with the core layer data by the combiner 340.

That is, the injection level controller 330 generates a power-reduced enhanced layer signal by reducing the power of the enhanced layer signal.

In this case, the combiner 340 may be viewed as generating a multiplexed signal by combining the core layer signal with the power-reduced enhanced layer signal.

The data obtained through the combination of the combiner 340 passes through the time interleaver 350 for distributing burst errors occurring over a channel, and is transmitted via the OFDM transmitter robust to multi-path and Doppler phenomena.

In this case, it can be seen that the time interleaver 350 performs interleaving that is applied to both the core layer signal and the enhanced layer signal. That is, the core layer and the enhanced layer share the time interleaver, thereby preventing the unnecessary use of memory and also reducing latency at the receiver.

Although will be described later in greater detail, the enhanced layer signal may correspond to enhanced layer data restored based on cancellation corresponding to the restoration of core layer data corresponding to the core layer signal.

Figure 4:
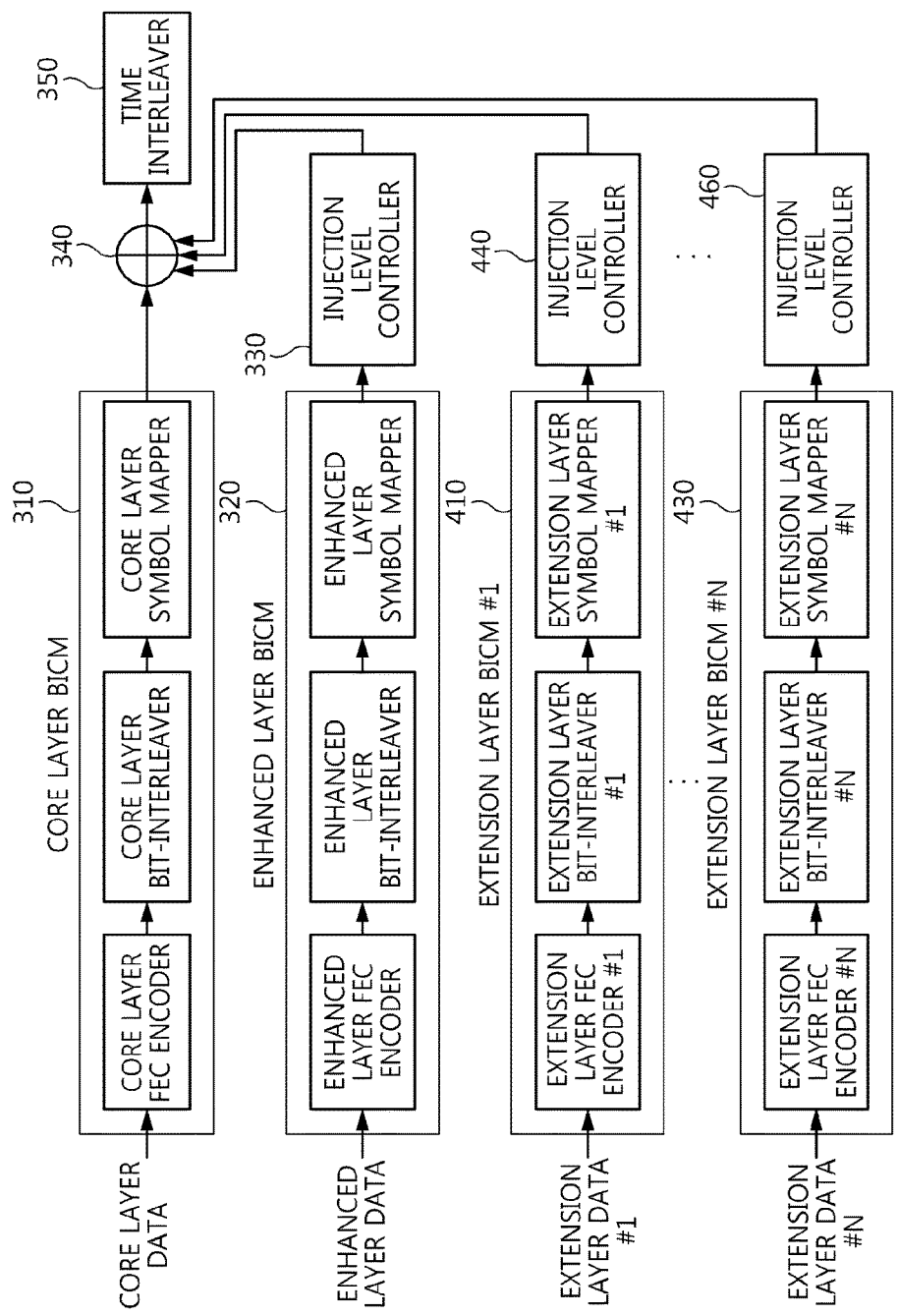
FIG. 4 is a block diagram illustrating another example of the signal multiplexer illustrated in FIG. 1.

FIG. 4 is a block diagram illustrating another example of the signal multiplexer illustrated in FIG. 1.

Referring to FIG. 4, it can be seen that a signal multiplexer multiplexes data corresponding to N (N is a natural number equal to or larger than 1) extension layers together in addition to core layer data and enhanced layer data.

That is, the signal multiplexer illustrated in FIG. 4 includes N extension layer BICM units 410, . . . , 430 and injection level controllers 440, . . . , 460 in addition to a core layer BICM unit 310, an enhanced layer BICM unit 320, an injection level controller 330, a combiner 340, and a time interleaver 350.

The core layer BICM unit 310, enhanced layer BICM unit 320, injection level controller 330, combiner 340 and time interleaver 350 illustrated in FIG. 4 have been described in detail in conjunction with FIG. 3.

Each of the N extension layer BICM units 410, . . . , 430 independently performs BICM encoding, and each of the injection level controllers 440, . . . , 460 performs power reduction corresponding to a corresponding extension layer, thereby enabling a power reduced extension layer signal to be combined with other layer signals via the combiner 340.

In particular, it is preferred that a reduction in power corresponding to each of the injection level controllers 440, . . . , 460 be higher than a reduction in power of the injection level controller 330. That is, a lower one of the injection level controllers 330, 440, . . . , 460 illustrated in FIG. 4 may correspond to a larger reduction in power.

In the present invention, power adjustment may be increasing or decreasing the power of an input signal, and may be increasing or decreasing the gain of an input signal.

The time interleaver 350 performs interleaving equally applied to the signals of the layers by interleaving the signals combined by the combiner 340.

Figure 5:
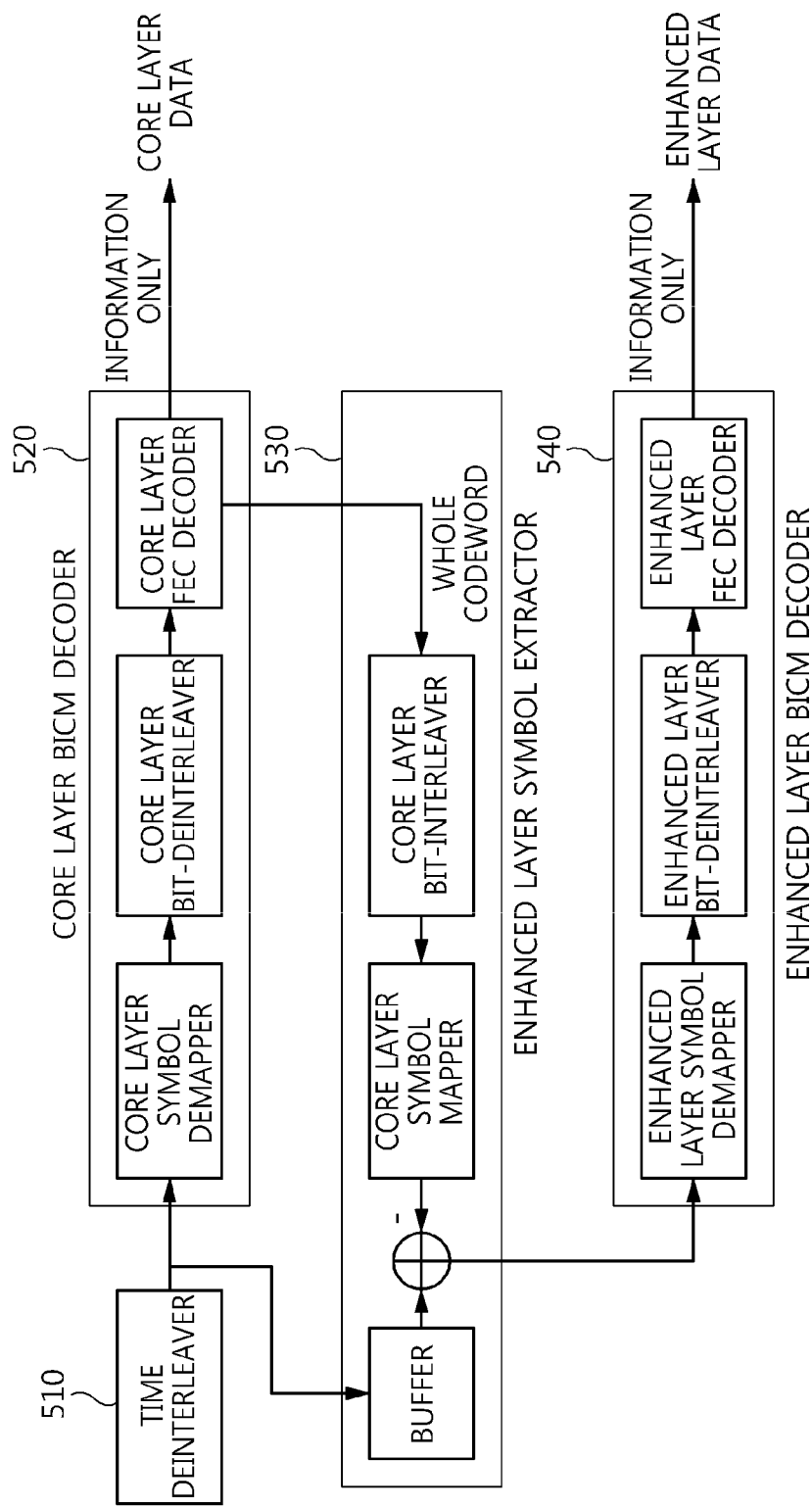
FIG. 5 is a block diagram illustrating an example of the signal demultiplexer illustrated in FIG. 1.

FIG. 5 is a block diagram illustrating an example of the signal demultiplexer illustrated in FIG. 1.

Referring to FIG. 5, a signal demultiplexer according to an embodiment of the present invention includes a time deinterleaver 510, a core layer BICM decoder 520, an enhanced layer symbol extractor 530, and an enhanced layer BICM decoder 540.

In this case, the signal demultiplexer illustrated in FIG. 5 may correspond to the signal multiplexer illustrated in FIG. 3.

The time deinterleaver 510 receives a received signal from an OFDM receiver for performing operations, such as synchronization, channel estimation and equalization, and performs an operation related to the distribution of burst errors occurring over a channel.

The output of the time deinterleaver 510 is provided to the core layer BICM decoder 520, and the core layer BICM decoder 520 restores core layer data.

In this case, the core layer BICM decoder 520 includes a core layer symbol demapper, a core layer bit deinterleaver, and a core layer error correction decoder. The core layer symbol demapper calculates Log-Likelihood Ratio (LLR) values related to symbols, the core layer bit deinterleaver strongly mixes the calculated LLR values with burst errors, and the core layer error correction decoder corrects error occurring over a channel.

In particular, the core layer error correction decoder may output only information bits, or may output whole bits in which information bits have been mixed with parity bits. In this case, the core layer error correction decoder may output only information bits as core layer data, and may output whole bits in which information bits have been mixed with parity bits to the enhanced layer symbol extractor 530.

The enhanced layer symbol extractor 530 is provided with the whole bits by the core layer BICM decoder 520 of the core layer error correction decoder, and extracts enhanced layer symbols from the output signal of the time deinterleaver 510.

In this case, the enhanced layer symbol extractor 530 includes a buffer, a subtracter, a core layer symbol mapper, and a core layer bit interleaver. The buffer stores the output signal of the time deinterleaver 510. The core layer bit interleaver receives the whole bits (information bits+parity bits) of the core layer BICM decoder, and performs the same core layer bit interleaving as the transmitter. The core layer symbol mapper generates core layer symbols, which are the same as the transmitter, from the interleaved signal. The subtracter obtains enhanced layer symbols by subtracting the output signal of the core layer symbol mapper from the signal stored in the buffer, and transfers the enhanced layer symbols to the enhanced layer BICM decoder 540.

In this case, the core layer bit interleaver and core layer symbol mapper included in the enhanced layer symbol extractor 530 may be the same as the core layer bit interleaver and the core layer symbol mapper illustrated in FIG. 3.

The enhanced layer BICM decoder 540 receives the enhanced layer symbols, and restores enhanced layer data.

In this case, the enhanced layer BICM decoder 540 may include an enhanced layer symbol demapper, an enhanced layer bit deinterleaver, and an enhanced layer error correction decoder. The enhanced layer symbol demapper calculates Log-Likelihood Ratio (LLR) values related to the enhanced layer symbols, the enhanced layer bit deinterleaver strongly mixes the calculated LLR values with burst errors, and the enhanced layer error correction decoder corrects error occurring over a channel.

That is, the signal demultiplexer illustrated in FIG. 5 restores core layer data first, leaves only enhanced layer symbols by cancellation core layer symbols in the received signal symbols, and then restores enhanced layer data. Since signals corresponding to respective layers are combined at different power levels, as described in conjunction with FIGS. 3 and 4, data restoration having the lowest error is achieved only when the restoration starts with the signal combined at the highest power level.

Figure 6:
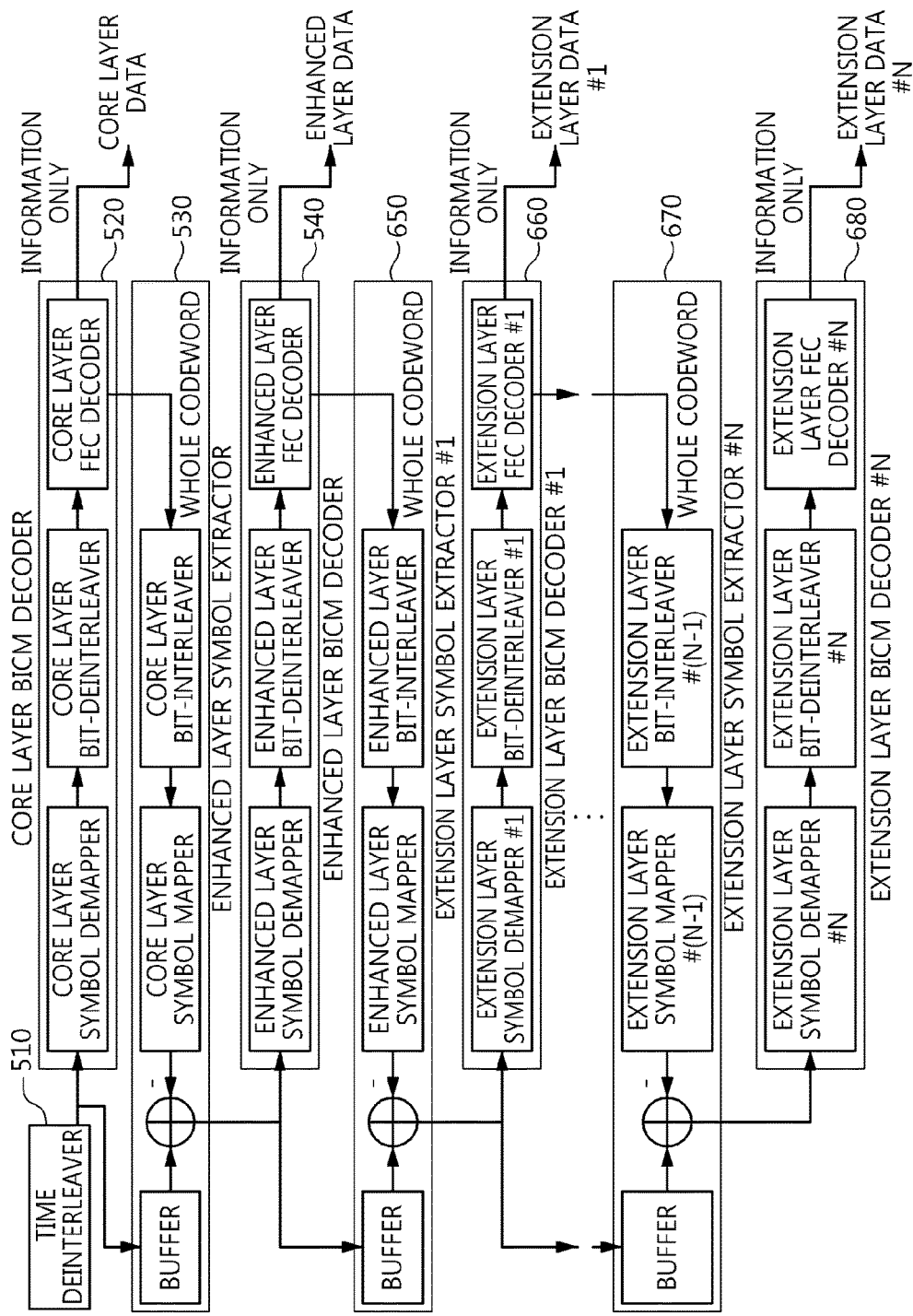
FIG. 6 is a block diagram illustrating another example of the signal demultiplexer illustrated in FIG. 1.

FIG. 6 is a block diagram illustrating another example of the signal demultiplexer illustrated in FIG. 1.

Referring to FIG. 6, a signal demultiplexer according to an embodiment of the present invention includes a time deinterleaver 510, a core layer BICM decoder 520, an enhanced layer symbol extractor 530, an enhanced layer BICM decoder 540, one or more extension layer symbol extractors 650 and 670, and one or more extension layer BICM decoders 660 and 680.

In this case, the signal demultiplexer illustrated in FIG. 6 may correspond to the signal multiplexer illustrated in FIG. 4.

The time deinterleaver 510 receives the received signal from the OFDM receiver that performs operations, such as synchronization, channel estimation and equalization, and performs the operation of distributing burst errors occurring over a channel.

The output of the time deinterleaver 510 is provided to the core layer BICM decoder 520, and the core layer BICM decoder 520 restores core layer data.

In this case, the core layer BICM decoder 520 includes a core layer symbol demapper, a core layer bit deinterleaver, and a core layer error correction decoder. The core layer symbol demapper calculates LLR values related to symbols, the core layer bit deinterleaver strongly mixes the calculated LLR values with burst errors, and the core layer error correction decoder corrects error occurring over a channel.

In particular, the core layer error correction decoder may output only information bits, or may output whole bits in which information bits have been combined with parity bits. In this case, the core layer error correction decoder may output only information bits as core layer data, and may output whole bits in which information bits have been mixed with parity bits to the enhanced layer symbol extractor 530.

The enhanced layer symbol extractor 530 receives whole bits from the core layer error correction decoder of the core layer BICM decoder 520, and extracts enhanced layer symbols from the output signal of the time deinterleaver 510.

In this case, the enhanced layer symbol extractor 530 includes a buffer, a subtracter, a core layer symbol mapper, and a core layer bit interleaver. The buffer stores the output signal of the time deinterleaver 510. The core layer bit interleaver receives whole bits (information bits+parity bits) of the core layer BICM decoder, and performs core layer bit interleaving that is the same as that of the transmitter. The core layer symbol mapper generates core layer symbols that are the same as those of the transmitter from the interleaved signal. The subtracter obtains enhanced layer symbols by subtracting the output signal of the core layer symbol mapper from the signal stored in the buffer, and transfers the enhanced layer symbols to the enhanced layer BICM decoder 540.

In this case, the core layer bit interleaver and the core layer symbol mapper included in the enhanced layer symbol extractor 530 may be the same as the core layer bit interleaver and the core layer symbol mapper illustrated in FIG. 4.

The enhanced layer BICM decoder 540 receives enhanced layer symbols, and restores enhanced layer data.

In this case, the enhanced layer BICM decoder 540 may include an enhanced layer symbol demapper, an enhanced layer bit deinterleaver, and an enhanced layer error correction decoder. The enhanced layer symbol demapper calculates LLR values related to the enhanced layer symbols, the enhanced layer bit deinterleaver strongly mixes the calculated LLR values with burst errors, and the enhanced layer error correction decoder corrects error occurring over a channel.

In particular, the enhanced layer error correction decoder may output only information bits, and may output whole bits in which information bits have been combined with parity bits. In this case, the enhanced layer error correction decoder may output only information bits as enhanced layer data, and may output whole bits in which information bits have been mixed with parity bits to the extension layer symbol extractor 650.

The extension layer symbol extractor 650 receives whole bits from the enhanced layer error correction decoder of the enhanced layer BICM decoder 540, and extracts extension layer symbols from the output signal of the subtracter of the enhanced layer symbol extractor 530.

In this case, the extension layer symbol extractor 650 includes a buffer, a subtracter, an enhanced layer symbol mapper, and an enhanced layer bit interleaver. The buffer stores the output signal of the subtracter of the enhanced layer symbol extractor. The enhanced layer bit interleaver receives the whole bits information (bits+parity bits) of the enhanced layer BICM decoder, and performs enhanced layer bit interleaving that is the same as that of the transmitter. The enhanced layer symbol mapper generates enhanced layer symbols, which are the same as those of the transmitter, from the interleaved signal. The subtracter obtains extension layer symbols by subtracting the output signal of the enhanced layer symbol mapper from the signal stored in the buffer, and transfers the extension layer symbols to the extension layer BICM decoder 660.

In this case, the enhanced layer bit interleaver and the enhanced layer symbol mapper included in the extension layer symbol extractor 650 are the same as the enhanced layer bit interleaver and the enhanced layer symbol mapper illustrated in FIG. 4.

The extension layer BICM decoder 660 receives the extension layer symbols, and restores extension layer data.

In this case, the extension layer BICM decoder 660 may include an extension layer symbol demapper, an extension layer bit deinterleaver, and an extension layer error correction decoder. The extension layer symbol demapper calculates LLR values related to the extension layer symbols, the extension layer bit deinterleaver strongly mixes the calculated LLR values with burst errors, and the extension layer error correction decoder corrects error occurring over a channel.

In particular, each of the extension layer symbol extractor and the extension layer BICM decoder may include two or more extractors or decoders if the extension layers are two or more in number.

That is, in the example illustrated in FIG. 6, the extension layer error correction decoder of the extension layer BICM decoder 660 may output only information bits, and may output whole bits in which information bits have been combined with parity bits. In this case, the extension layer error correction decoder outputs only information bits as extension layer data, and may output whole bits in which information bits have been mixed with parity bits to the subsequent extension layer symbol extractor 670.

The configuration and operation of the extension layer symbol extractor 670 and the extension layer BICM decoder 680 can be easily understood from the configuration and operation of the above-described extension layer symbol extractor 650 and extension layer BICM decoder 660.

It can be seen that the signal demultiplexer illustrated in FIG. 6 restores core layer data first, restores enhanced layer data using the cancellation of core layer symbols, and restores extension layer data using the cancellation of enhanced layer symbols. Two or more extension layers may be provided, in which case restoration starts with an extension layer combined at a higher power level.

Since the signal multiplexer illustrated in FIGS. 3 and 4 is configured such that two or more signals are combined at different power levels, it may be necessary to adjust the power levels after combination. That is, when a core layer signal and an enhanced layer signal are combined by a combiner, the power level of an obtained multiplexing signal may be higher than that of the core layer signal or enhanced layer signal before the combination, and thus a problem, such as the distortion of a signal, attributable to such an increase in power may occur during signal transmission/reception.

Figure 7:
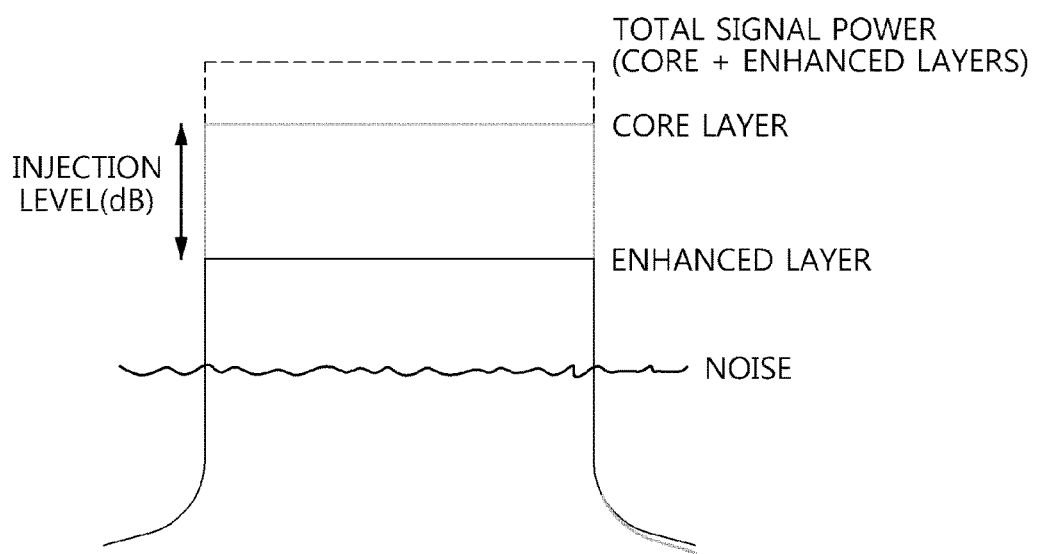
FIG. 7 is a diagram showing an increase in power attributable to the combination of a core layer signal and an enhanced layer signal.

FIG. 7 is a diagram showing an increase in power attributable to the combination of a core layer signal and an enhanced layer signal.

Referring to FIG. 7, it can be seen that when a multiplexed signal is generated by combining a core layer signal with an enhanced layer signal power reduced by an injection level, the power level of the multiplexed signal is higher than that of the core layer signal or enhanced layer signal.

In this case, the injection level adjusted by the injection level controller illustrated in FIG. 3 or 4 may be adjusted from 3.0 dB to 10.0 dB in steps of 0.5 dB. When the injection level is 3.0 dB, the power of the enhanced layer signal is lower than that of the core layer signal by 3 dB. When the injection level is 10.0 dB, the power of the enhanced layer signal is lower than the power of the core layer signal by 10 dB. This relationship is applied not only between the core layer signal and the enhanced layer signal but also between the enhanced layer signal and the extension layer signal or between the extension layer signals.

Figure 8:
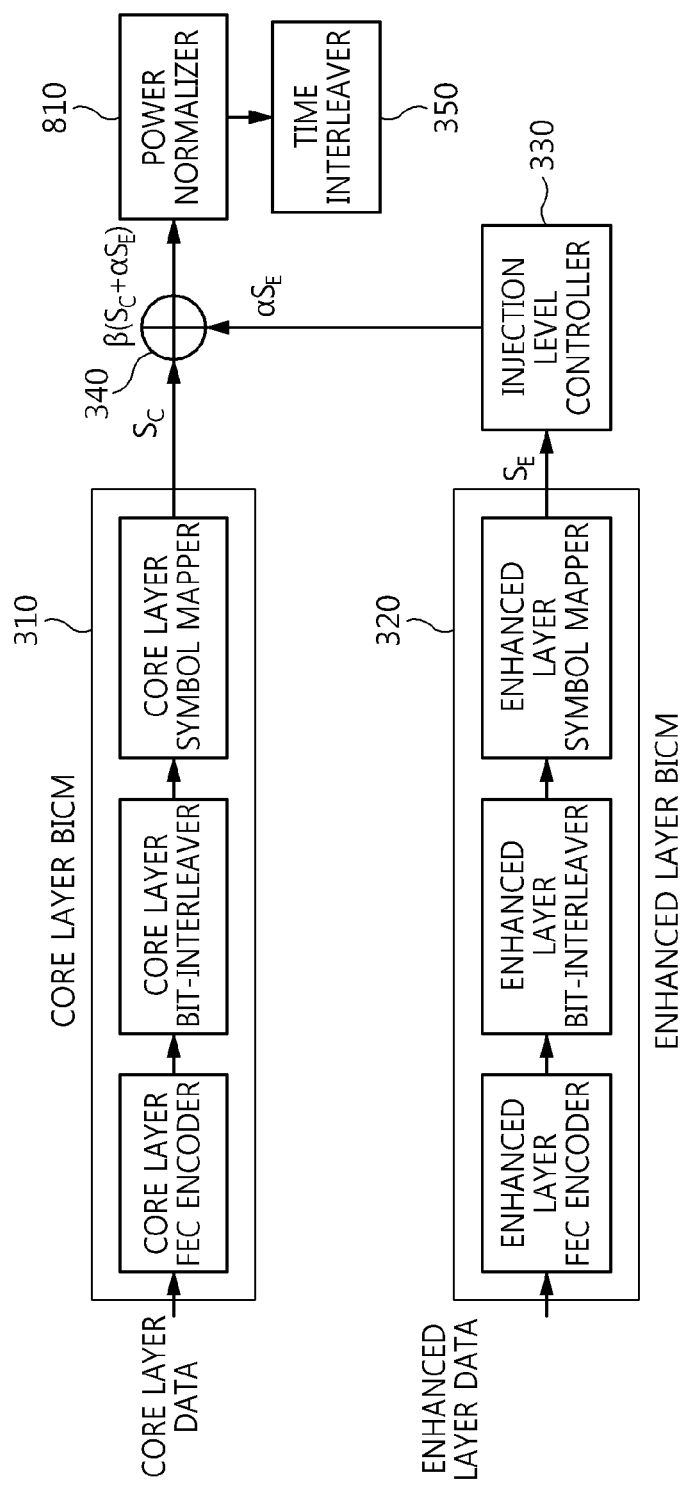
FIG. 8 is a block diagram illustrating another example of the signal multiplexer illustrated in FIG. 1.

FIG. 8 is a block diagram illustrating another example of the signal multiplexer illustrated in FIG. 1.

Referring to FIG. 8, a signal multiplexer according to an embodiment of the present invention may include a core layer BICM unit 310, an enhanced layer BICM unit 320, an injection level controller 330, a combiner 340, a power normalizer 810, and a time interleaver 350.

Generally, a BICM device includes an error correction encoder, a bit interleaver, and a symbol mapper. Each of the core layer BICM unit 310 and the enhanced layer BICM unit 320 illustrated in FIG. 8 may include an error correction encoder, a bit interleaver, and a symbol mapper.

As illustrated in FIG. 8, core layer data and enhanced layer data passes through different respective BICM units, and are then combined by the combiner 340.

That is, the core layer data passes through the core layer BICM unit 310, the enhanced layer data passes through the enhanced layer BICM unit 320 and then the injection level controller 330, and the core layer data and the enhanced layer data are combined by the combiner 340. In this case, the enhanced layer BICM unit 320 may perform BICM encoding different from that of the core layer BICM unit 310. That is, the enhanced layer BICM unit 320 may perform higher bit rate error correction encoding or symbol mapping than the core layer BICM unit 310. Furthermore, the enhanced layer BICM unit 320 may perform less robust error correction encoding or symbol mapping than the core layer BICM 310 unit.

For example, the core layer error correction encoder may exhibit a lower bit rate than the enhanced layer error correction encoder. In this case, the enhanced layer symbol mapper may be less robust than the core layer symbol mapper.

The combiner 340 may be viewed as functioning to combine the core layer signal and the enhanced layer signal at different power levels.

The core layer data uses forward error correction (FEC) code having a low code rate in order to perform robust reception, while the enhanced layer data uses FEC code having a high code rate in order to achieve a high data transmission rate.

That is, the core layer data may have a broader coverage than the enhanced layer data in the same reception environment.

The enhanced layer data having passed through the enhanced layer BICM unit 320 is adjusted in gain (or power) by the injection level controller 330, and is combined with the core layer data by the combiner 340.

That is, the injection level controller 330 generates a power-reduced enhanced layer signal by reducing the power of the enhanced layer signal.

In this case, the injection level controller 330 may control the injection level from 3.0 dB to 10.0 dB in steps of 0.5 dB.

In this case, the combiner 340 may be viewed as generating a multiplexed signal by combining the core layer signal with the power-reduced enhanced layer signal.

The signal obtained by the combination of the combiner 340 is provided to the power normalizer 810 so that the power of the signal can be reduced by an increase in power caused by the combination of the core layer signal and the enhanced layer signal, and then power adjustment is performed. That is, the power normalizer 810 reduces the power of the signal, obtained by the multiplexing of the combiner 340, to a power level corresponding to the core layer signal. Since the level of the combined signal is higher than the level of one layer signal, the power normalizing of the power normalizer 810 is required in order to prevent amplitude clipping, etc. in the remaining portion of a broadcast signal transmission/reception system.

Assuming that the power levels of the core layer signal and the enhanced layer signal are normalized to 1 when an enhanced layer signal $S_E$ is injected into a core layer signal $S_C$ at a preset injection level, a combined signal may be expressed by $S_C + \alpha S_E$.

In this case, α is scaling factors corresponding to various injection levels. That is, the injection level controller 330 may correspond to the scaling factor.

For example, when the injection level of an enhanced layer is 3 dB, a combined signal may be expressed by $$S_C + \sqrt{\frac{1}{2}} S_E.$$

Since the power of a combined signal (a multiplexed signal) increases compared to a core layer signal, the power normalizer 810 needs to mitigate the increase in power.

The output of the power normalizer 810 may be expressed by $\beta(S_C + \alpha S_E)$.

In this case, β is normalizing factors based on various injection levels of the enhanced layer.

When the injection level of the enhanced layer is 3 dB, the power of the combined signal is increased by 50% compared to that of the core layer signal. Accordingly, the output of the power normalizer 810 may be expressed by $$\sqrt{\frac{2}{3}}\left(S_C + \sqrt{\frac{1}{2}} S_E\right).$$

TABLE 1

| EL Injection level relative to CL | Scaling factor α | Normalizing factor β |
|---|---|---|
| 3.0 dB | 0.7079458 | 0.8161736 |
| 3.5 dB | 0.6683439 | 0.8314061 |
| 4.0 dB | 0.6309573 | 0.8457262 |
| 4.5 dB | 0.5956621 | 0.8591327 |
| 5.0 dB | 0.5623413 | 0.8716346 |
| 5.5 dB | 0.5308844 | 0.8832495 |
| 6.0 dB | 0.5011872 | 0.8940022 |
| 6.5 dB | 0.4731513 | 0.9039241 |
| 7.0 dB | 0.4466836 | 0.9130512 |
| 7.5 dB | 0.4216965 | 0.9214231 |
| 8.0 dB | 0.3981072 | 0.9290819 |
| 8.5 dB | 0.3758374 | 0.9360712 |
| 9.0 dB | 0.3548134 | 0.9424353 |
| 9.5 dB | 0.3349654 | 0.9482180 |
| 10.0 dB | 0.3162278 | 0.9534626 |

That is, the power normalizer 810 corresponds to the normalizing factor, and reduces the power of the multiplexed signal by an amount by which the combiner 340 has increased the power.

In this case, each of the normalizing factor and the scaling factor may be a rational number larger than 0 and smaller than 1.

In this case, the scaling factor may decrease as a reduction in power corresponding to the injection level controller 330 becomes larger, and the normalizing factor may increase as a reduction in power corresponding to the injection level controller 330 becomes larger.

The power normalized signal passes through the time interleaver 350 for distributing burst errors occurring over a channel, and is transmitted via the OFDM transmitter robust to multi-path and Doppler phenomena.

In this case, it can be seen that the time interleaver 350 performs interleaving that is applied to both the core layer signal and the enhanced layer signal. That is, the core layer and the enhanced layer share the time interleaver, thereby preventing the unnecessary use of memory and also reducing latency at the receiver.

Although will be described later in greater detail, the enhanced layer signal may correspond to enhanced layer data restored based on cancellation corresponding to the restoration of core layer data corresponding to the core layer signal. The combiner 340 may combine one or more extension layer signals having power levels lower than those of the core layer signal and the enhanced layer signal with the core layer signal and the enhanced layer signal.

Figure 9:
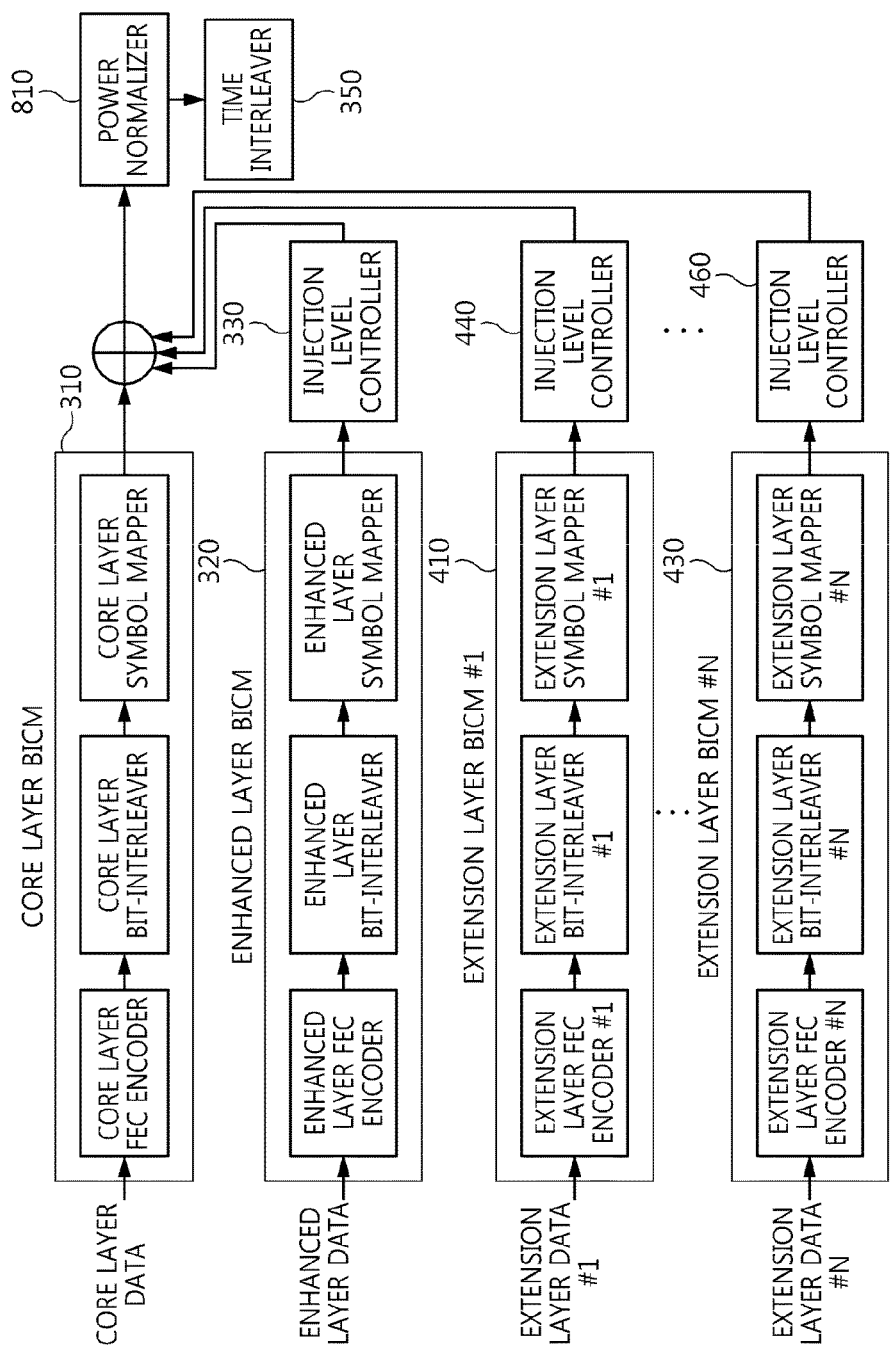
FIG. 9 is a block diagram illustrating still another example of the signal multiplexer illustrated in FIG. 1.

FIG. 9 is a block diagram illustrating still another example of the signal multiplexer illustrated in FIG. 1.

Referring to FIG. 9, it can be seen that a signal multiplexer multiplexes data corresponding to N (N is a natural number equal to or larger than 1) extension layers together in addition to core layer data and enhanced layer data.

That is, the signal multiplexer illustrated in FIG. 9 includes N extension layer BICM units 410, . . . , 430 and injection level controllers 440, . . . , 460 in addition to a core layer BICM unit 310, an enhanced layer BICM unit 320, an injection level controller 330, a combiner 340, a power normalizer 810, and a time interleaver 350.

The core layer BICM unit 310, enhanced layer BICM unit 320, injection level controller 330, combiner 340 and time interleaver 350 illustrated in FIG. 9 have been described in detail in conjunction with FIG. 3.

Each of the N extension layer BICM units 410, . . . , 430 independently performs BICM encoding, and each of the injection level controllers 440, . . . , 460 performs power reduction corresponding to a corresponding extension layer, thereby enabling a power reduced extension layer signal to be combined with other layer signals via the combiner 340.

In particular, it is preferred that a reduction in power corresponding to each of the injection level controllers 440, . . . , 460 be higher than a reduction in power of the injection level controller 330. That is, a lower one of the injection level controllers 330, 440, . . . , 460 illustrated in FIG. 9 may correspond to a larger reduction in power.

In the present invention, power adjustment may be increasing or decreasing the power of an input signal, and may be increasing or decreasing the gain of an input signal.

The power normalizer 810 mitigates an increase in power caused by the combination of a plurality of layer signals by the combiner 340.

The time interleaver 350 performs interleaving equally applied to the signals of the layers by interleaving the normalized signals.

Figure 10:
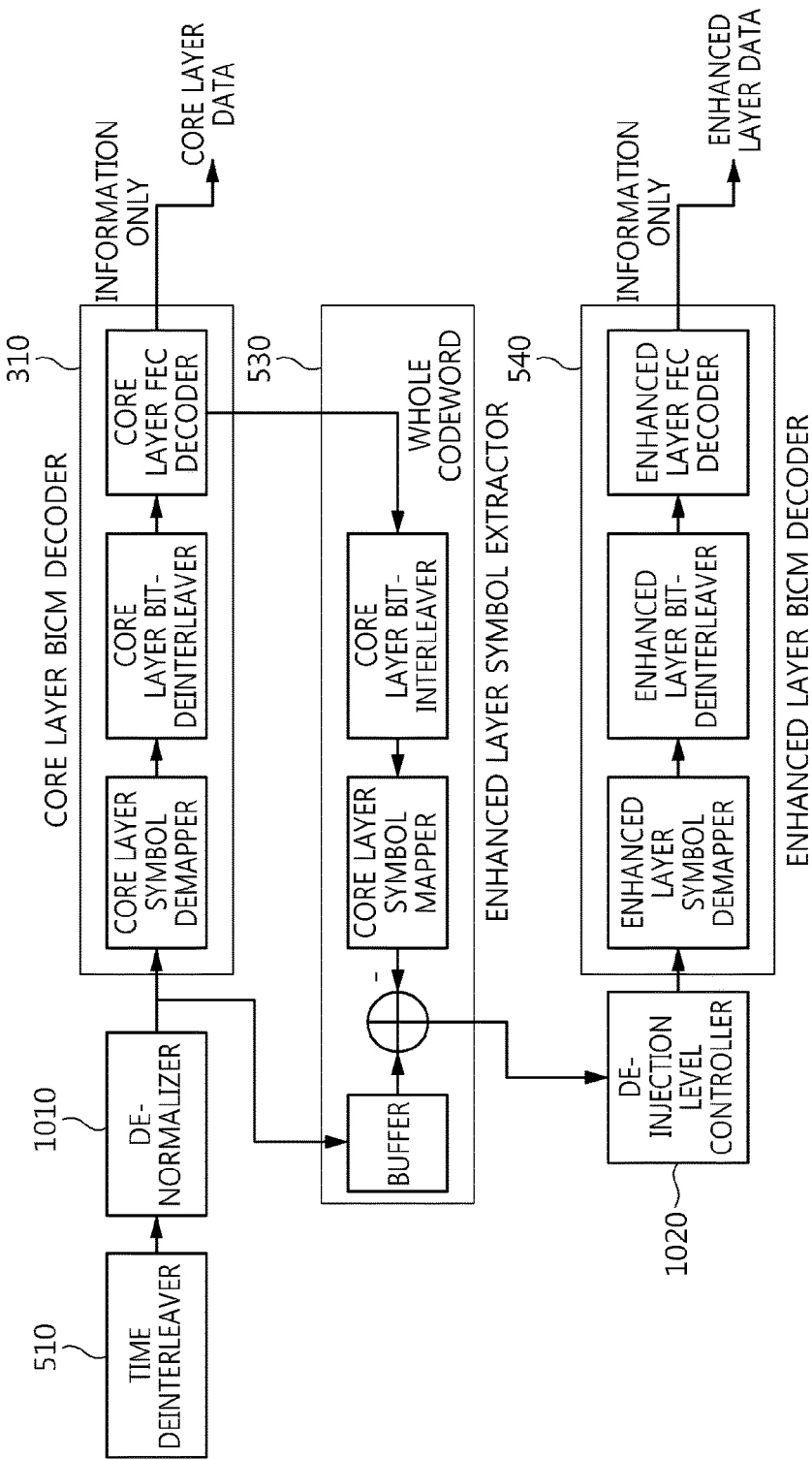
FIG. 10 is a block diagram illustrating still another example of the signal demultiplexer illustrated in FIG. 1.

FIG. 10 is a block diagram illustrating still another example of the signal demultiplexer illustrated in FIG. 1.

Referring to FIG. 10, a signal demultiplexer according to an embodiment of the present invention includes a time deinterleaver 510, a de-normalizer 1010, core layer BICM decoder 520, an enhanced layer symbol extractor 530, a de-injection level controller 1020, and an enhanced layer BICM decoder 540.

In this case, the signal demultiplexer illustrated in FIG. 10 may correspond to the signal multiplexer illustrated in FIG. 8.

The time deinterleaver 510 receives a received signal from an OFDM receiver for performing operations, such as synchronization, channel estimation and equalization, and performs an operation related to the distribution of burst errors occurring over a channel.

The de-normalizer 1010 corresponds to the power normalizer of the transmitter, and increases power by an amount by which the power normalizer has decreased the power.

Although the de-normalizer 1010 is illustrated as adjusting the power of the output signal of the time interleaver 510 in the example illustrated in FIG. 10, the de-normalizer 1010 may be located before the time interleaver 510 so that power adjustment is performed before interleaving in some embodiments.

That is, the de-normalizer 1010 may be viewed as being located before or after the time interleaver 510 and amplifying the magnitude of a signal for the purpose of the LLR calculation of the core layer symbol demapper.

The output of the time deinterleaver 510 (or the output of the de-normalizer 1010) is provided to the core layer BICM decoder 520, and the core layer BICM decoder 520 restores core layer data.

In this case, the core layer BICM decoder 520 includes a core layer symbol demapper, a core layer bit deinterleaver, and a core layer error correction decoder. The core layer symbol demapper calculates LLR values related to symbols, the core layer bit deinterleaver strongly mixes the calculated LLR values with burst errors, and the core layer error correction decoder corrects error occurring over a channel.

In particular, the core layer error correction decoder may output only information bits, or may output whole bits in which information bits have been mixed with parity bits. In this case, the core layer error correction decoder may output only information bits as core layer data, and may output whole bits in which information bits have been mixed with parity bits to the enhanced layer symbol extractor 530.

The enhanced layer symbol extractor 530 is provided with the whole bits by the core layer BICM decoder 520 of the core layer error correction decoder, and extracts enhanced layer symbols from the output signal of the time deinterleaver 510.

In this case, the enhanced layer symbol extractor 530 includes a buffer, a subtracter, a core layer symbol mapper, and a core layer bit interleaver. The buffer stores the output signal of the time deinterleaver 510 or de-normalizer 1010. The core layer bit interleaver receives the whole bits (information bits+parity bits) of the core layer BICM decoder, and performs the same core layer bit interleaving as the transmitter. The core layer symbol mapper generates core layer symbols, which are the same as the transmitter, from the interleaved signal. The subtracter obtains enhanced layer symbols by subtracting the output signal of the core layer symbol mapper from the signal stored in the buffer, and transfers the enhanced layer symbols to the de-injection level controller 1020.

In this case, the core layer bit interleaver and core layer symbol mapper included in the enhanced layer symbol extractor 530 may be the same as the core layer bit interleaver and the core layer symbol mapper illustrated in FIG. 8.

The de-injection level controller 1020 receives the enhanced layer symbols, and increases the power of the input signal by an amount by which the injection level controller of the transmitter has decreased the power. That is, the de-injection level controller 1020 amplifies the input signal, and provides the amplified input signal to the enhanced layer BICM decoder 540. For example, if at the transmitter, the power used to combine the enhanced layer signal is lower than the power used to combine the core layer signal by 3 dB, the de-injection level controller 1020 functions to increase the power of the input signal by 3 dB.

The enhanced layer BICM decoder 540 receives the enhanced layer symbol whose power has been increased by the de-injection level controller 1020, and restores the enhanced layer data.

In this case, the enhanced layer BICM decoder 540 may include an enhanced layer symbol demapper, an enhanced layer bit deinterleaver, and an enhanced layer error correction decoder. The enhanced layer symbol demapper calculates LLR values related to the enhanced layer symbols, the enhanced layer bit deinterleaver strongly mixes the calculated LLR values with burst errors, and the enhanced layer error correction decoder corrects error occurring over a channel.

That is, the signal demultiplexer illustrated in FIG. 10 restores core layer data first, leaves only the enhanced layer symbols by cancellation the core layer symbols in the received signal symbols, and then restores enhanced layer data by increasing the power of the enhanced layer symbols.

Figure 11:
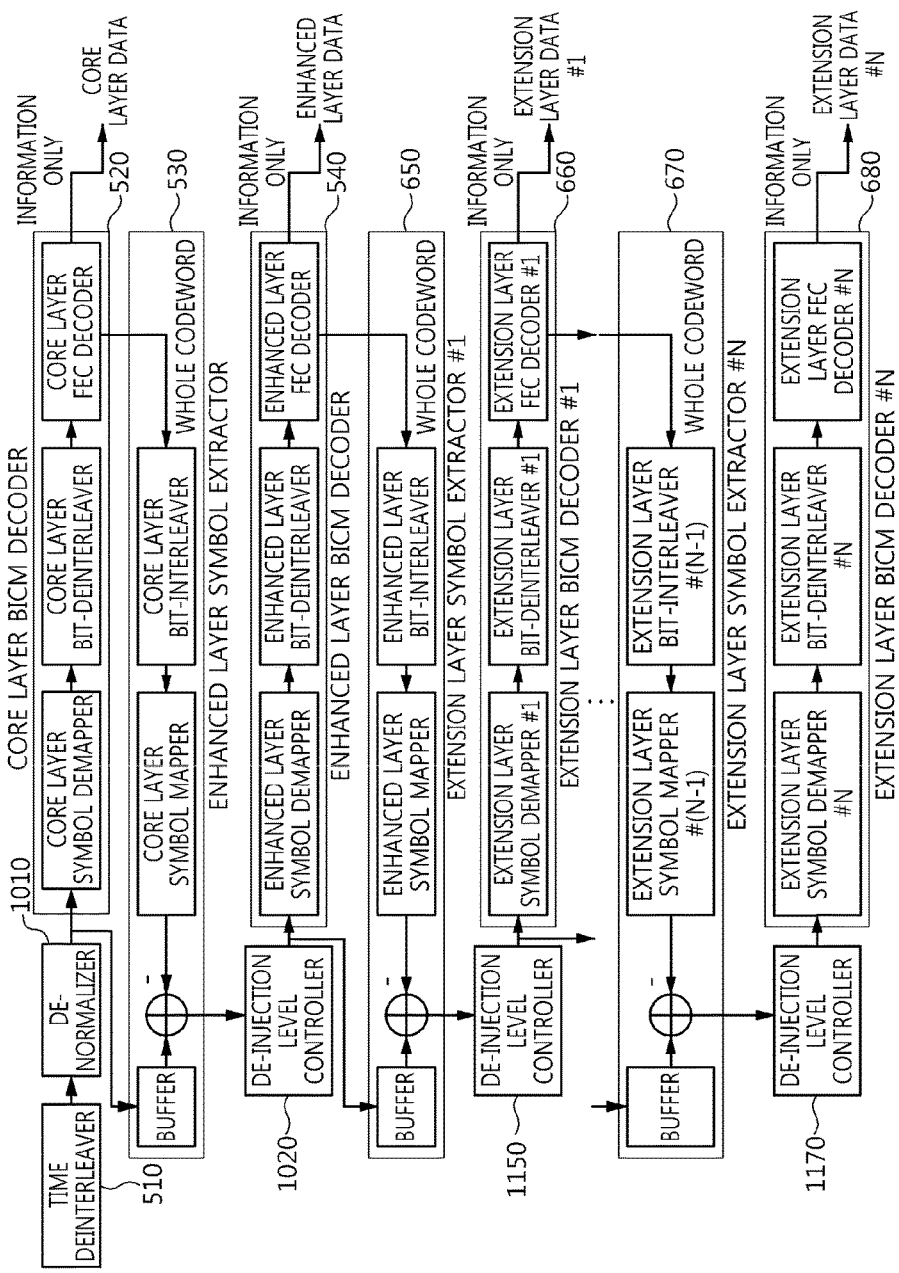
FIG. 11 is a block diagram illustrating still another example of the signal demultiplexer illustrated in FIG. 1.

FIG. 11 is a block diagram illustrating still another example of the signal demultiplexer illustrated in FIG. 1.

Referring to FIG. 11, a signal demultiplexer according to an embodiment of the present invention includes a time deinterleaver 510, a de-normalizer 1010, a core layer BICM decoder 520, an enhanced layer symbol extractor 530, an enhanced layer BICM decoder 540, one or more extension layer symbol extractors 650 and 670, one or more extension layer BICM decoders 660 and 680, and de-injection level controllers 1020, 1150 and 1170.

In this case, the signal demultiplexer illustrated in FIG. 11 may correspond to the signal multiplexer illustrated in FIG. 9.

The time deinterleaver 510 receives a received signal from an OFDM receiver for performing operations, such as synchronization, channel estimation and equalization, and performs an operation related to the distribution of burst errors occurring over a channel.

The de-normalizer 1010 corresponds to the power normalizer of the transmitter, and increases power by an amount by which the power normalizer has decreased the power.

Although the de-normalizer 1010 is illustrated as adjusting the power of the output signal of the time interleaver 510 in the example illustrated in FIG. 11, the de-normalizer 1010 may be located before the time interleaver 510 so that power adjustment is performed before interleaving in some embodiments.

That is, the de-normalizer 1010 may be viewed as being located before or after the time interleaver 510 and amplifying the magnitude of a signal for the purpose of the LLR calculation of the core layer symbol demapper.

The output of the time deinterleaver 510 (or the output of the de-normalizer 1010) is provided to the core layer BICM decoder 520, and the core layer BICM decoder 520 restores core layer data.

In this case, the core layer BICM decoder 520 includes a core layer symbol demapper, a core layer bit deinterleaver, and a core layer error correction decoder. The core layer symbol demapper calculates LLR values related to symbols, the core layer bit deinterleaver strongly mixes the calculated LLR values with burst errors, and the core layer error correction decoder corrects error occurring over a channel.

In particular, the core layer error correction decoder may output only information bits, or may output whole bits in which information bits have been mixed with parity bits. In this case, the core layer error correction decoder may output only information bits as core layer data, and may output whole bits in which information bits have been mixed with parity bits to the enhanced layer symbol extractor 530.

The enhanced layer symbol extractor 530 is provided with the whole bits by the core layer BICM decoder 520 of the core layer error correction decoder, and extracts enhanced layer symbols from the output signal of the time deinterleaver 510.

In this case, the enhanced layer symbol extractor 530 includes a buffer, a subtracter, a core layer symbol mapper, and a core layer bit interleaver. The buffer stores the output signal of the time deinterleaver 510 or de-normalizer 1010. The core layer bit interleaver receives the whole bits (information bits+parity bits) of the core layer BICM decoder, and performs the same core layer bit interleaving as the transmitter. The core layer symbol mapper generates core layer symbols, which are the same as the transmitter, from the interleaved signal. The subtracter obtains enhanced layer symbols by subtracting the output signal of the core layer symbol mapper from the signal stored in the buffer, and transfers the enhanced layer symbols to the de-injection level controller 1020.

In this case, the core layer bit interleaver and core layer symbol mapper included in the enhanced layer symbol extractor 530 may be the same as the core layer bit interleaver and the core layer symbol mapper illustrated in FIG. 9.

The de-injection level controller 1020 receives the enhanced layer symbols, and increases the power of the input signal by an amount by which the injection level controller of the transmitter has decreased the power. That is, the de-injection level controller 1020 amplifies the input signal, and provides the amplified input signal to the enhanced layer BICM decoder 540.

The enhanced layer BICM decoder 540 receives the enhanced layer symbol whose power has been increased by the de-injection level controller 1020, and restores the enhanced layer data.

In this case, the enhanced layer BICM decoder 540 may include an enhanced layer symbol demapper, an enhanced layer bit deinterleaver, and an enhanced layer error correction decoder. The enhanced layer symbol demapper calculates LLR values related to the enhanced layer symbols, the enhanced layer bit deinterleaver strongly mixes the calculated LLR values with burst errors, and the enhanced layer error correction decoder corrects error occurring over a channel.

In particular, the enhanced layer error correction decoder may output only information bits, and may output whole bits in which information bits have been combined with parity bits. In this case, the enhanced layer error correction decoder may output only information bits as enhanced layer data, and may output whole bits in which information bits have been mixed with parity bits to the extension layer symbol extractor 650.

The extension layer symbol extractor 650 receives whole bits from the enhanced layer error correction decoder of the enhanced layer BICM decoder 540, and extracts extension layer symbols from the output signal of the de-injection level controller 1020.

In this case, the de-injection level controller 1020 may amplify the power of the output signal of the subtracter of the enhanced layer symbol extractor 530.

In this case, the extension layer symbol extractor 650 includes a buffer, a subtracter, an enhanced layer symbol mapper, and an enhanced layer bit interleaver. The buffer stores the output signal of the de-injection level controller 1020. The enhanced layer bit interleaver receives the whole bits information (bits+parity bits) of the enhanced layer BICM decoder, and performs enhanced layer bit interleaving that is the same as that of the transmitter. The enhanced layer symbol mapper generates enhanced layer symbols, which are the same as those of the transmitter, from the interleaved signal. The subtracter obtains extension layer symbols by subtracting the output signal of the enhanced layer symbol mapper from the signal stored in the buffer, and transfers the extension layer symbols to the extension layer BICM decoder 660.

In this case, the enhanced layer bit interleaver and the enhanced layer symbol mapper included in the extension layer symbol extractor 650 are the same as the enhanced layer bit interleaver and the enhanced layer symbol mapper illustrated in FIG. 9.

The de-injection level controller 1150 increases power by an amount by which the injection level controller of a corresponding layer has decreased the power at the transmitter.

The extension layer BICM decoder 660 receives the extension layer symbols whose power has been increased by the de-injection level controller 1150, and restores extension layer data.

In this case, the extension layer BICM decoder 660 may include an extension layer symbol demapper, an extension layer bit deinterleaver, and an extension layer error correction decoder. The extension layer symbol demapper calculates LLR values related to the extension layer symbols, the extension layer bit deinterleaver strongly mixes the calculated LLR values with burst errors, and the extension layer error correction decoder corrects error occurring over a channel.

In particular, each of the extension layer symbol extractor and the extension layer BICM decoder may include two or more extractors or decoders if two or more extension layers are present.

That is, in the example illustrated in FIG. 6, the extension layer error correction decoder of the extension layer BICM decoder 660 may output only information bits, and may output whole bits in which information bits have been combined with parity bits. In this case, the extension layer error correction decoder outputs only information bits as extension layer data, and may output whole bits in which information bits have been mixed with parity bits to the subsequent extension layer symbol extractor 670.

The configuration and operation of the extension layer symbol extractor 670, the extension layer BICM decoder 680 and the de-injection level controller 1170 can be easily understood from the configuration and operation of the above-described extension layer symbol extractor 650, extension layer BICM decoder 660 and de-injection level controller 1150.

A lower one of the de-injection level controllers 1020, 1150 and 1170 illustrated in FIG. 11 may correspond to a larger increase in power. That is, the de-injection level controller 1150 may increase power more than the de-injection level controller 1020, and the de-injection level controller 1170 may increase power more than the de-injection level controller 1150.

It can be seen that the signal demultiplexer illustrated in FIG. 11 restores core layer data first, restores enhanced layer data using the cancellation of core layer symbols, and restores extension layer data using the cancellation of enhanced layer symbols. Two or more extension layers may be provided, in which case restoration starts with an extension layer combined at a higher power level.

Figure 12:
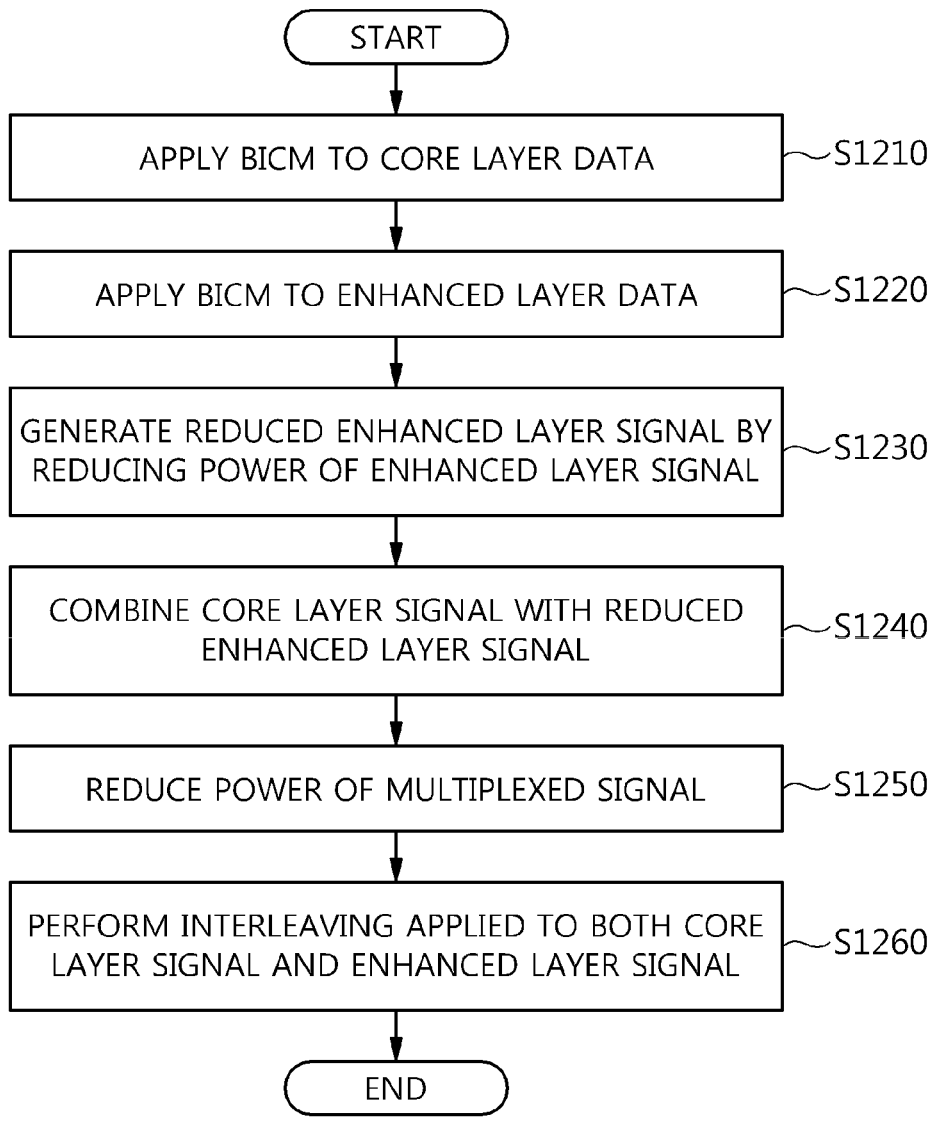
FIG. 12 is an operation flowchart illustrating a signal multiplexing method according to an embodiment of the present invention.

FIG. 12 is an operation flowchart illustrating a signal multiplexing method according to an embodiment of the present invention.

Referring to FIG. 12, in the signal multiplexing method according to the present embodiment, BICM is applied to core layer data at step S1210.

Furthermore, in the signal multiplexing method according to the present embodiment, BICM is applied to enhanced layer data at step S1220.

The BICM applied at step S1220 may be different from the BICM applied to step S1210. In this case, the BICM applied at step S1220 may be less robust than the BICM applied to step S1210. In this case, the bit rate of the BICM applied at step S1220 may be less robust than that of the BICM applied to step S1210.

In this case, an enhanced layer signal may correspond to the enhanced layer data that is restored based on cancellation corresponding to the restoration of the core layer data corresponding to a core layer signal.

Furthermore, in the signal multiplexing method according to the present embodiment, a power-reduced enhanced layer signal is generated by reducing the power of the enhanced layer signal at step S1230.

In this case, at step S1230, an injection level may be changed from 3.0 dB to 10.0 dB in steps of 0.5 dB.

Furthermore, in the signal multiplexing method according to the present embodiment, a multiplexed signal is generated by combining the core layer signal and the power-reduced enhanced layer signal at step S1240.

That is, at step S1240, the core layer signal and the enhanced layer signal are combined at different power levels so that the power level of the enhanced layer signal is lower than the power level of the core layer signal.

In this case, at step S1240, one or more extension layer signals having lower power levels than the core layer signal and the enhanced layer signal may be combined along with the core layer signal and the enhanced layer signal.

Furthermore, in the signal multiplexing method according to the present embodiment, the power of the multiplexed signal is reduced at step S1250.

In this case, at step S1250, the power of the multiplexed signal may be reduced to the power of the core layer signal. In this case, at step S1250, the power of the multiplexed signal may be reduced by an amount by which the power has been increased at step S1240.

Furthermore, in the signal multiplexing method according to the present embodiment, interleaving applied to both the core layer signal and the enhanced layer signal is performed at step S1260.

The signal multiplexing method illustrated in FIG. 12 may correspond to steps S240 and S250 illustrated in FIG. 2.

As described above, with respect to the signal multiplexing apparatus and method according to the present invention, the configurations and operations of the above-described embodiments are not restrictively applied, but all or some of the embodiments may be selectively combined and configured so that the embodiments may be modified in various ways.

The invention claimed is:

1. A signal multiplexing apparatus, comprising:
an injection level controller configured to generate a power-reduced enhanced layer signal by reducing power of an enhanced layer signal;
a combiner configured to generate a multiplexed signal by combining a core layer signal and the power-reduced enhanced layer signal;
a time interleaver configured to perform interleaving applied to both a core layer corresponding to the core layer signal and an enhanced layer corresponding to the enhanced layer signal; and
a power normalizer configured to reduce power of the multiplexed signal to power corresponding to the core layer signal,
wherein the injection level controller corresponds to a scaling factor and the power normalizer corresponds to a normalizing factor, and the scaling factor decreases as a reduction in power corresponding to the injection level controller becomes larger, and the normalizing factor increases as a reduction in power corresponding to the injection level controller becomes larger.

2. The signal multiplexing apparatus of claim 1, wherein the injection level controller changes an injection level with predetermined step sizes, the predetermined step sizes including 0.5 dB.

3. A signal multiplexing method, comprising:
generating a power-reduced enhanced layer signal by reducing power of an enhanced layer signal;
combining a core layer signal and the power-reduced enhanced layer signal for generating a multiplexed signal;
performing interleaving applied to both a core layer corresponding to the core layer signal and an enhanced layer corresponding to the enhanced layer signal; and
reducing power of the multiplexed signal to power corresponding to the core layer signal,
wherein the reducing power of the enhanced layer signal corresponds to a scaling factor and the reducing power of the multiplexed signal corresponds to a normalizing factor, and the scaling factor decreases as a reduction in power corresponding to the reducing power of the enhanced layer signal becomes larger, and the normalizing factor increases as a reduction in power corresponding to the reducing power of the enhanced layer signal becomes larger.

\* \* \* \* \*